(12) United States Patent
Poon et al.

(10) Patent No.: US 8,912,102 B2
(45) Date of Patent: Dec. 16, 2014

(54) LASER ANNEALING

(75) Inventors: Chyiu Hyia Poon, Singapore (SG); Alex K H See, Singapore (SG); Meisheng Zhou, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 755 days.

(21) Appl. No.: 12/396,441

(22) Filed: Mar. 2, 2009

(65) Prior Publication Data
US 2010/0221926 A1    Sep. 2, 2010

(51) Int. Cl.
*H01L 21/00*      (2006.01)
*H01L 21/268*    (2006.01)
*H01L 21/324*    (2006.01)

(52) U.S. Cl.
CPC .............. *H01L 21/268* (2013.01); *H01L 21/324* (2013.01)
USPC ............. 438/795; 438/487; 438/5; 438/14; 257/E21.134; 219/121.8

(58) Field of Classification Search
CPC ............................ H01L 21/268; H01L 21/324
USPC ................. 438/166, 5–18, 795; 219/121.8
See application file for complete search history.

(56) References Cited

U.S. PATENT DOCUMENTS

| | | | | |
|---|---|---|---|---|
| 5,943,593 | A * | 8/1999 | Noguchi et al. | 438/487 |
| 6,303,411 | B1 * | 10/2001 | Camm et al. | 438/149 |
| 6,410,368 | B1 * | 6/2002 | Kawasaki et al. | 438/145 |
| 6,919,533 | B2 * | 7/2005 | Yamazaki et al. | 219/121.8 |
| 6,927,109 | B1 * | 8/2005 | Tanaka et al. | 438/166 |
| 2002/0171845 | A1 * | 11/2002 | Drake, Jr. | 356/502 |
| 2003/0100169 | A1 * | 5/2003 | Tanaka et al. | 438/487 |
| 2003/0183612 | A1 * | 10/2003 | Timans et al. | 219/390 |

FOREIGN PATENT DOCUMENTS

JP        63130295 A  *  6/1988  ............ B23K 26/06

OTHER PUBLICATIONS

S.C. Tsou, "Front and Back Surface cw CO2-Laser Annealing of Arsenic Ion-Implanted Silicon" Appl. Phys. 23, 163-168 (1980).*
D. M. Hsieh, "Observation of Plasma Effect in Nanosecond Pulsed LAser Annealing on Silicon Prior to Melting" Chinese Journal of Physics vol. 36, No. 4, pp. 635-641 (1998).*
Lue, "An automatic X-Y scanning controller for laser annealing of ion-implanted semiconductors" J. Phys. E: Sci. Instrum., vol. 15, pp. 705-707 (1982).*
Ishihara et al. "Location-Controlled Adjacent Grains Following Excimer-Laser Melting of Si Thin-Films", 1998, AM-LCD '98, pp. 153-156.*

* cited by examiner

*Primary Examiner* — Leonard Chang
(74) *Attorney, Agent, or Firm* — Horizon IP Pte. Ltd.

(57) ABSTRACT

A system for and method of processing an article such as a semiconductor wafer is disclosed. The wafer includes first and second surfaces which are segmented into a plurality of first and second zones. The first surface of the wafer, for example, on which devices or ICs are formed is processed by, for example, laser annealing while the second surface is heated with a backside heating source. Corresponding, or at least substantially corresponding, zones on the first and second surfaces are processed synchronously to reduce variations of post laser anneal thermal budget across the wafer.

23 Claims, 6 Drawing Sheets

LASER ANNEALING

BACKGROUND

Integrated circuits (ICs) typically comprise numerous circuit components interconnected to perform the desired functions. Such circuit components include, for example, transistors. A transistor may include a gate between source and drain regions. To form the source and drain regions, dopants are implanted into the substrate. The implanted dopants need to be electrically activated. Activation, for example, can be achieved by subjecting the substrate to high temperatures, such as annealing.

As technology continues to scale, for example, to 65 nm or below, laser based anneals, have been developed to address needs of ultra-low thermal budgets demands. However, we have discovered that laser-based annealing can result in non-uniformity or a wide variation in resistance within the wafer. Such non-uniformity or variations in resistance is undesirable because it adversely affects the uniformity of the device performance across the wafer. This could have a detrimental effect on the product yield.

SUMMARY

A method of semiconductor fabrication is presented. The method includes providing a substrate having first and second surfaces. The first and second surfaces are segmented into a plurality of first and second zones. The first zones on the first surface are processed individually and the second zones on the second surface are processed individually. Corresponding first and second zones on the first and second surfaces are synchronously processed.

In another embodiment, a method of fabricating an article is disclosed. The method includes providing an article having first and second surfaces. The first and second surfaces are segmented into first and second zones. The first zones on the first surface are processed individually and the second zones on the second surface are processed individually. Corresponding zones on the first and second surfaces are synchronously processed.

In yet another embodiment, a semiconductor processing system is presented. The processing system includes a stage for mounting a substrate to be processed. The system also includes an excitation system for processing first zones on a first surface of the substrate and a heating source for processing second zones on a second surface of the substrate. The excitation system and heating source are configured to process the corresponding first and second zones on the first and second surfaces synchronously.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to processing or processing systems. Embodiments can be employed, for example, for forming semiconductor devices or integrated circuits (ICs). Various types of devices can be formed, for example dynamic or static random access memories, signal processors, or system-on-chip devices. The devices can be incorporated into, for example, consumer electronic products, such as computers, cell phones, and personal digital assistants (PDAs). Embodiments may also be applied to other industries of applications.

Figure 1:
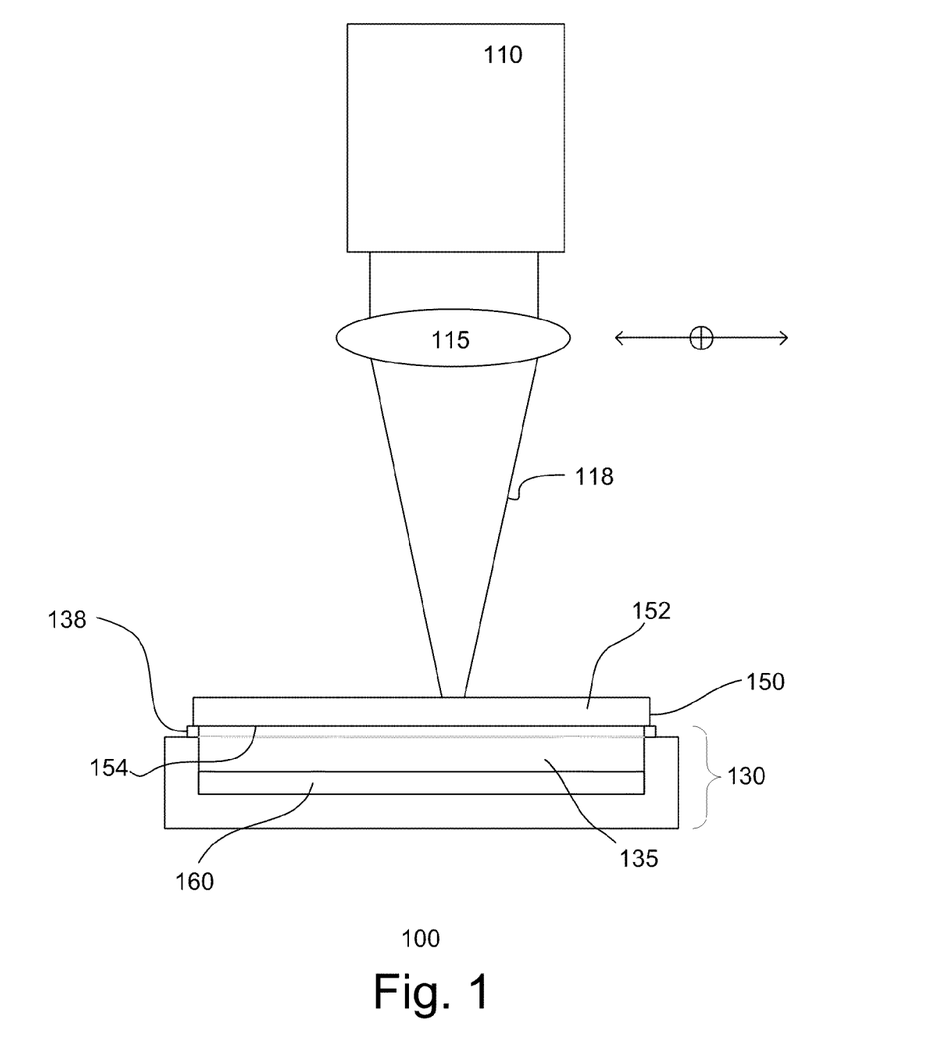
FIG. 1 shows an embodiment of a processing system.

FIG. 1 shows a simplified diagram of an embodiment of a processing system 100. In one embodiment, the processing system is an annealing system. The annealing system can be employed to, for example, anneal a substrate prepared with doped regions, such as source/drain regions of a transistor, for dopant activation. The processing system may also be employed for other purposes, such as silicidation.

As shown, the processing system comprises an excitation source 110. In one embodiment, the excitation source comprises a radiation source. Various types of radiation sources maybe employed. In one embodiment, the radiation source comprises a laser source. The laser source, for example, comprises a $CO_2$ laser. Other types of radiation or laser sources may also be useful. The excitation source, for example, serves as an annealing or heating source.

An optical system 115 is provided. Although the optical system is depicted as a single optical lens for simplification, it is understood that the optical system can include a plurality of lenses. The optical system receives radiation from the excitation source. It also projects an image of the radiation onto, for example, a processing surface 152 of an article 150 disposed on a stage 130. The article 150 can be, for example, a semiconductor wafer. The semiconductor wafer includes first and second opposing surfaces. The first surface, for example, comprises a front surface on which devices or ICs are formed while the second surface comprises a back surface. In one embodiment, the radiation processes the first surface of a semiconductor wafer. The image can be, for example, rectangular or square in shape. Other types of images can also be used. In one embodiment, the beam image is optimized to obtain the best uniformity performance across the wafer and maintained constant. Temperature can be tuned by adjusting the laser power. Other techniques for adjusting the temperature may also be useful. The excitation source and optical system may be collectively referred to as an excitation system.

The stage or chuck 130 holds an article 150 to be processed, such as a semiconductor wafer. The stage or chuck, for example, holds the wafer in place by vacuum pressure. Processing other types of articles is also useful.

The processing of the wafer front surface can be achieved by focusing a scanning beam from the excitation system onto the wafer surface. In one embodiment, the excitation system comprises a translatable excitation system. For example, the excitation system is translatable in the x-y direction formed by a plane of the surface 152 of the article to be processed. For other applications, the excitation source 110 and the optical system 115 may be translatable multi-dimensionally. Since the spot size of the radiation image or beam is generally smaller than the article, providing a translatable excitation system enables different parts of the article to be processed by the image. In one embodiment, the translatable excitation system enables the processing surface of the article to be fully processed by the radiation. For example, the translatable excitation system enables the radiation to anneal the first or front surface of the wafer. In alternative embodiments, the stage may be translatable while the excitation system is fixed or both the stage and excitation system may be translatable.

Figure 2:
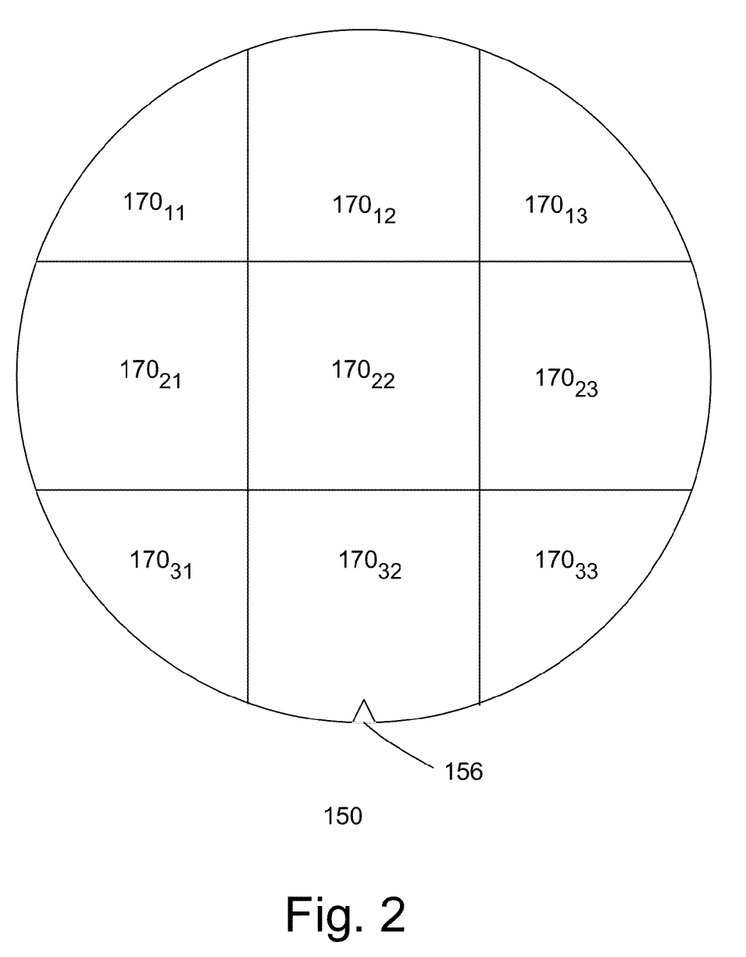
FIG. 2 shows an embodiment of a wafer.

FIG. 2 shows a semiconductor wafer 150. The semiconductor wafer, for example, can be a 300 mm wafer on which a plurality of dies are formed in parallel. Other sized wafers are also useful. The wafer is diced after processing is completed to produce individual dies. The dies are assembled and packaged into ICs.

The wafer includes a notch 156 for orientation purposes. The wafer is divided into a plurality of zones $170_{xy}$ arranged in a matrix of rows x and columns y. As shown, the wafer is illustratively divided into zones arranged in a 3×3 matrix. In alternative embodiments, the wafer can be divided into other number of zones or matrix size.

In one embodiment, the wafer is attached to the chuck by vacuum pressure. Once the wafer is attached to the chuck, the translatable excitation system is set at the home position. From the home position, the excitation system is translated to process the zones of the wafer. In one embodiment, the zones are processed one row at a time. In one embodiment, the rows are processed one row at a time in a snake configuration. Other configurations are also useful. For example, zones $170_{11}$-$170_{13}$ in the first row are processed by translating the excitation system from the home position in the positive x direction (from column 1 to column 3). After the first row is finished, the excitation system translates to process the second row of zones by the radiation image. In one embodiment, the second row is processed by moving the excitation system in the negative x direction to process zones $170_{23}$-$170_{21}$. After processing of the second row is finished, the excitation system is positioned to process the third row of zones. For example, the excitation system is translated in the negative y direction and then in the positive x direction to process zones $170_{31}$-$170_{33}$. In this manner, all zones of the wafer are processed. As described, the zones are processed one row at a time in sequence. Alternatively, the zones can be processed using other sequences or orders.

The excitation system can be translated in the column direction in a continuous or scanning motion to process a row of zones. Alternatively, the excitation system can be translated in the row direction to process a column of zones. The scanning processes the zones, for example, in an overlapping manner. For example, the speed of the excitation system can be adjusted as desired to provide the desired processing time for the zones. Translating the excitation system in other configurations or arrangements is also useful for processing the wafer.

In conventional laser annealing, the chuck is heated to uniformly heat the backside of the wafer. For example, the chuck is heated at a temperature of about 300 to 450° C. However, we have discovered that by heating the back surface of the wafer uniformly using the chuck, post-laser thermal anneal (post-LSA) budget varies across the wafer. For example, the first zone that is processed first will have the greatest post-LSA thermal budget while the last zone processed will have the least post-LSA thermal budget. Post-LSA heating causes deactivation of dopants which can increase resistance. This variation post-LSA thermal budget leads to different degrees of deactivation across the wafer, resulting in large variations of resistance across the wafer.

Figure 3:
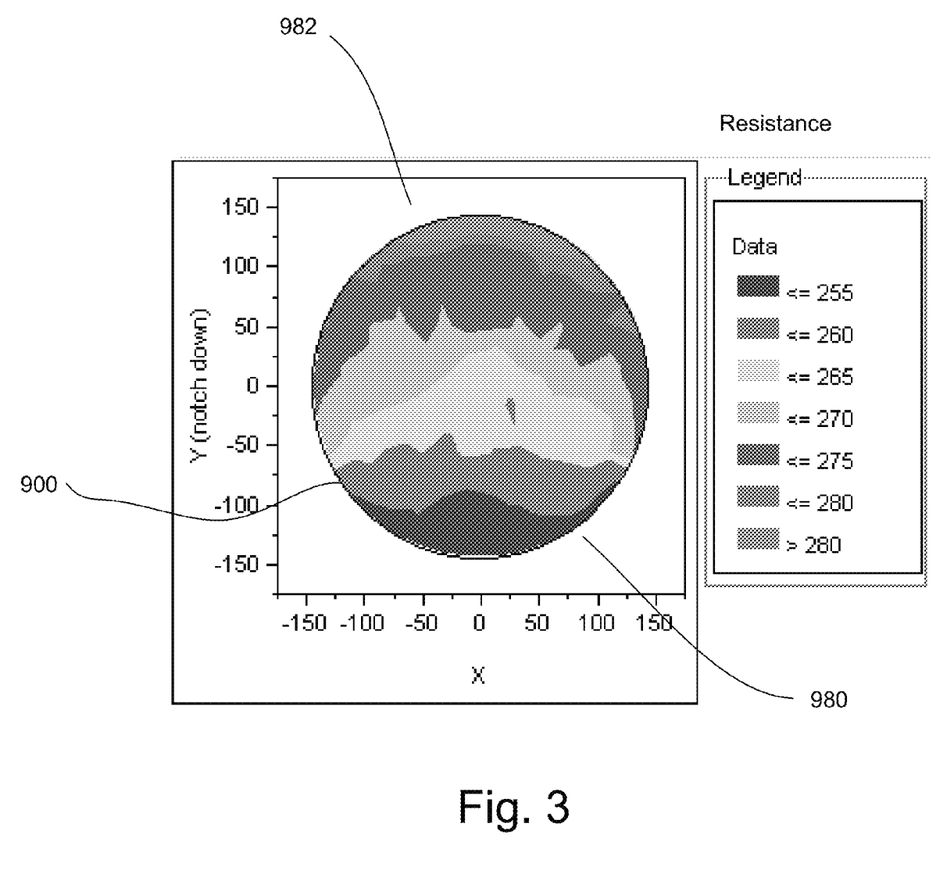
FIG. 3 shows a laser annealed wafer with uniform backside heating.

FIG. 3 shows a 300 mm wafer 900 processed by laser anneal with the backside uniformly heated to a temperature of about 300 to 450° C. The first surface of the wafer was blanket implanted with As dopants. The dopants were implanted at an energy level of 1 to 50 keV with a concentration of about 1E14 to 1E16 atoms/cm². Laser anneal was performed on the wafer. The laser anneal scanned across the first surface in a row by row manner from the top portion (portion opposite of the notch) to the bottom portion of the wafer (portion with the notch). For example, the first row is scanned in the x-direction, followed by subsequent rows (in the y-direction) until the wafer is completely processed. The average speed for the scanning of the laser anneal is, for example, about 180 mm/s. Resistance at different parts of the wafer was measured via the use of a 4-point probe measurement tool.

As shown, the resistance in zones at the bottom (notch) portion of the wafer which receives the lowest post-LSA thermal budget is the lowest while the resistance in zones at the top (opposite to notch) portion which receives the highest post-LSA thermal budget is the highest. For example, the resistance in the top portion has a resistance of greater than about 280 ohm/sq while the bottom portion has a resistance of less than about 255 ohm/sq. As evidenced by FIG. 3, conventional LSA produces a variation in resistance across the wafer which is at least greater than about 10%. Such a large variance in resistance across the wafer adversely affects the uniformity of the device performance across the wafer. This could have a detrimental effect on the product yield.

Referring back to FIG. 1, the stage includes a backside heating source 160. The heating source serves to heat a non-processing surface 154 of the article. For example, the heating source serves to heat the second or backside surface of the wafer. In one embodiment, the backside heating source heats the back surface of the wafer in a non-uniform manner. For example, the non-uniform heating source heats a portion or portions without heating the whole back surface of the wafer.

In one embodiment, the heating source comprises a synchronized backside heating source. The synchronized backside heating source processes or heats the zone or zones of the backside surface of the wafer corresponding or substantially corresponding to the zone or zones of the front surface that is being processed by the excitation radiation.

In one embodiment, the backside heating source comprises a lamp array. The lamp array may include a plurality of lamps arranged in rows and/or columns. For example, the lamps may be arranged or aligned in rows for processing a row of zones. Aligning the lamps in columns for processing a column of zones may also be useful. Other configurations of lamps may also be useful. The lamps for example, may comprise heat lamps, such as tungsten halogen lamps. Other types of annealing or heating lamps are also useful.

A lamp can be configured to cover a zone on the backside corresponding to a zone on the frontside of the wafer. In other embodiments, a lamp is configured to cover a smaller zone on the backside than the frontside zone. For example, more than one lamp can cover a zone on the frontside of the wafer. Lamps can also be configured to be overlapping. For example, adjacent lamps can cover common portion of the same zone or zones as well as non-common portions of adjacent zones. Other configurations are also useful. Smaller zones can improve synchronicity of frontside and backside heating.

The lamps of the lamp array can be selectively switched on to heat the zone or zones on the back surface of the wafer corresponding or substantially corresponding to the zone or zones of the front surface that is being processed by the excitation radiation. In one embodiment, a row (or column) of lamps is/are sequentially activated to heat a row (or column) of zones in sequence in the back surface, which corresponds to a row (or column) of zones which are sequentially processed on the front surface by the excitation radiation. In other embodiments, a row of lamps in the lamp array is selectively activated to heat a row of zones in the back surface which corresponds to the row of zones processed on the front surface. Other configurations of activating the lamp array are also useful.

In alternative embodiments, the backside heating source comprises an excitation source. The backside excitation source, for example, can be similar to the frontside excitation source. In one embodiment, the backside excitation source comprises a laser source. For example, the backside excitation source comprises a $CO_2$ laser. The backside excitation source can be configured with a backside optical system to form a backside excitation system. Other types of radiation sources and/or systems may also be useful. The radiation images of the frontside and backside can be aligned, for example, to process corresponding zones of the front and back surfaces of the wafer.

In one embodiment, the backside heating source, such as the lamp array, is disposed in a cavity 135 of the chuck. A guard ring 138 is provided on the chuck. The guard ring provides a mounting surface for the edge of the wafer, allowing the backside heating source to heat the exposed backside of the wafer.

Figure 4A:
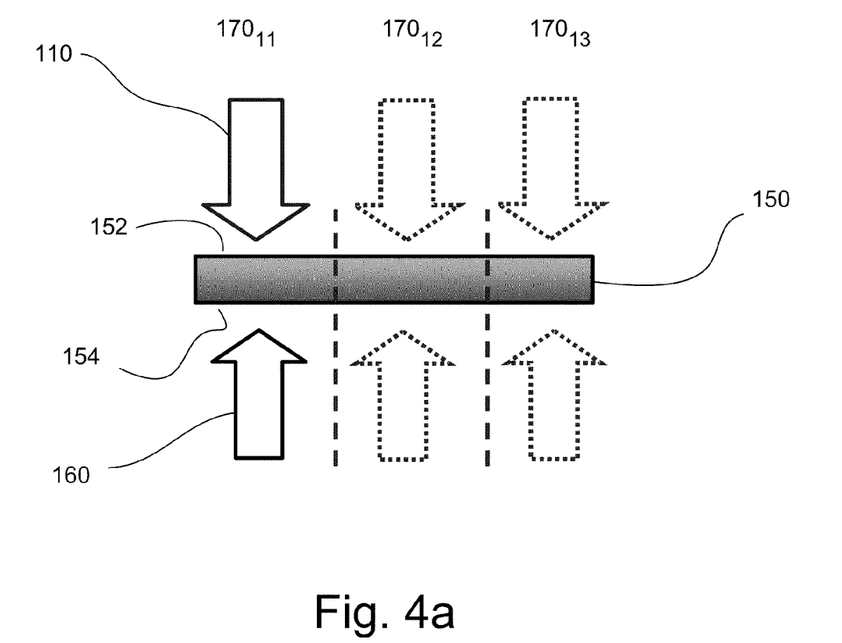
FIGS. 4a-c show an embodiment of processing an article.
Figure 4B:
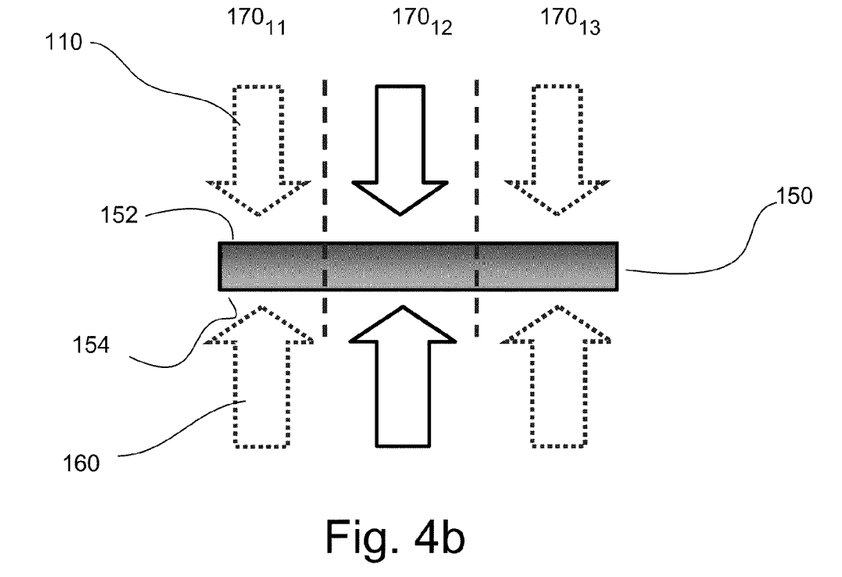
Figure 4C:
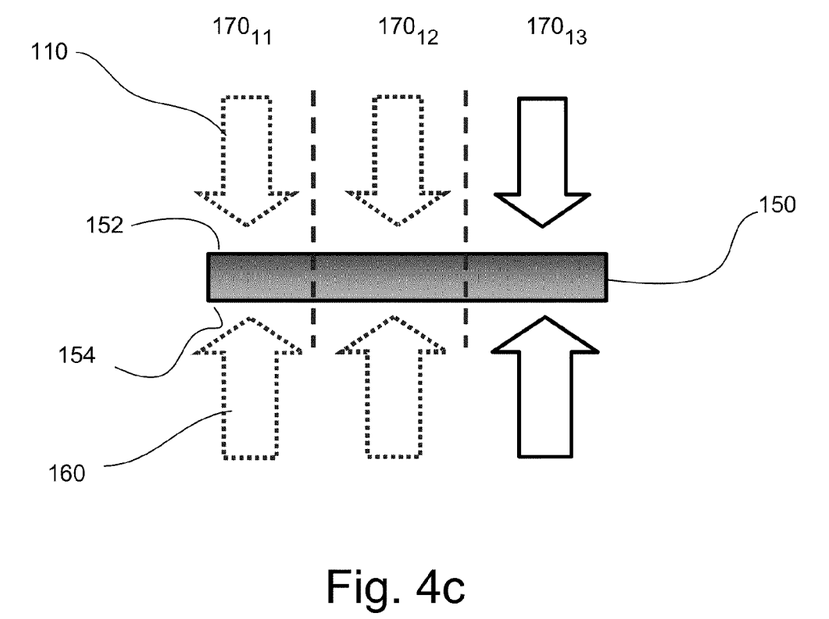

FIGS. 4a-c show an embodiment of a process for processing an article 150. The article comprises at least first and second major surfaces 152 and 154. The major surfaces may be opposing surfaces. In one embodiment, the article comprises a semiconductor wafer with opposing first and second major surfaces. The first major surface, for example, is the front surface on which devices or ICs are formed while the second major surface is the back surface. A frontside excitation source 110 is provided for processing the front surface and a backside heating source 160 is provided for processing the back surface of the wafer. In one embodiment, zones of the wafer are processed one at a time. As illustrated, the first row of zones $170_{11}$-$170_{13}$ of the wafer is processed.

Referring to FIG. 4a, the frontside excitation source processes the first zone $170_{11}$ of the first row. At the same time, the backside excitation source is heating at least the zone on the back surface corresponding to the first zone of the first row. As the excitation system is translated, the second zone $170_{12}$ in the first row on the front surface is processed by the frontside excitation source, as shown in FIG. 4b. Likewise, the backside heating source is synchronized to heat at least the zone on the back surface of the wafer corresponding to the second zone of the first row.

FIG. 4c shows the third zone of the first row of the wafer in the front and back surfaces being processed by the frontside excitation and backside heating sources as the excitation system continues to be translated. The process continues to, for example, process the front and back surfaces of the wafer corresponding to the other zones of the wafer. For example, the other rows of zones are sequentially heated until processing of the wafer is completed.

Figure 5:
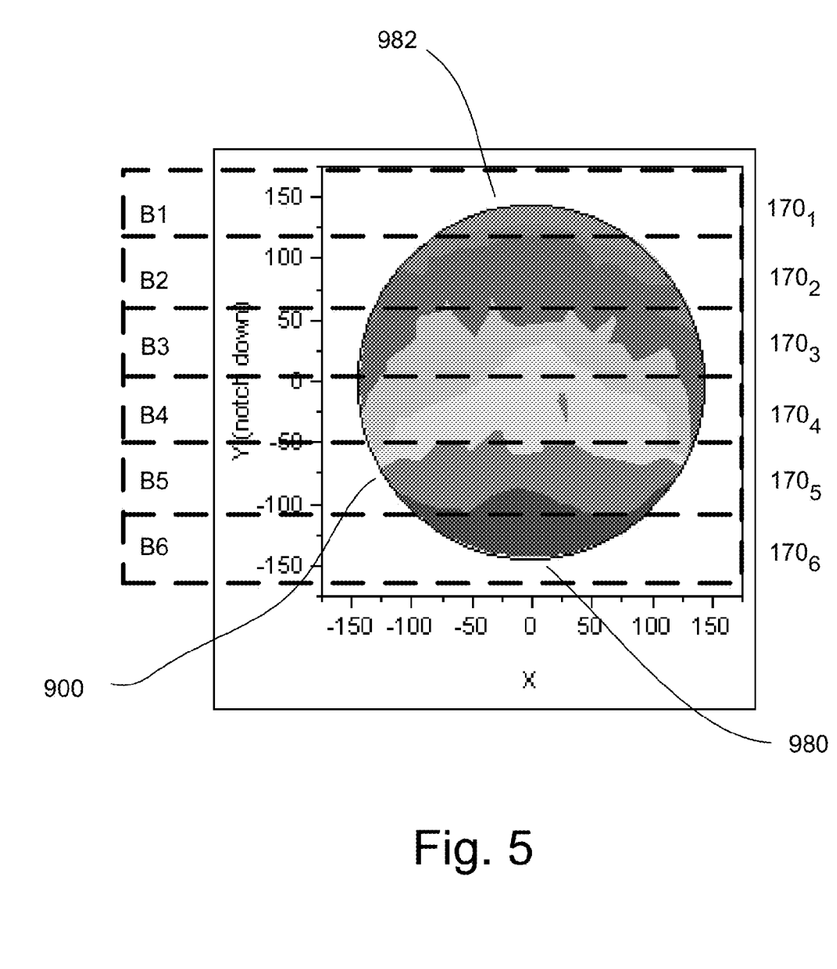
FIG. 5 shows an embodiment of achieving selective backside heating via the use of lamp arrays.

FIG. 5 shows an alternative embodiment of processing an article 150, such as a semiconductor wafer. As shown, the wafer comprises a 300 mm wafer. Processing other types of articles or wafers is also useful. The wafer is separated into n rows of zones. Illustratively, the wafer is separated into six rows of zones $170_{1-6}$ (e.g., n=6). Separating the wafer into other number of rows of zones is also useful. For example, the number of rows may correspond to the number of rows which a frontside excitation source scans to process the front surface of the wafer. Other configurations of synchronized frontside and backside heating may also be useful. For example, the number of different zones may correspond to the number of different sheet resistance zones across the wafer, such as that measured in FIG. 3.

A backside heating source 160 is provided to heat back surface of the wafer. In one embodiment, the backside heating source comprises a lamp array. The lamp array is selected to heat the back surface of the wafer in segments or rows. In one embodiment, the lamp array heats the back surface of the wafer in b segments or rows. In one embodiment, the number of segments is equal to the number of rows of zones (b=n). Other configurations of heating the back surface of the wafer are also useful, such as in the case where b≠n. In one embodiment, the frontside excitation source processes the zones of the wafer one row at a time. The frontside excitation source, for example, scans or steps across a row of the zones of the wafer a row at a time. The frontside excitation source, in one embodiment, processes the rows sequentially from the first row $171_1$ to the last row $170_6$. Processing the frontside in other sequences or configurations is also useful.

As the frontside excitation source processes a row of zones on the front surface, the backside heating source heats a corresponding row on the back surface. In one embodiment, the backside heating source heats the whole corresponding row of zones simultaneously. For example, when the frontside excitation source begins to scan or steps across the first row on the front surface, the backside heating source heats the first row on the back surface. This continues for subsequent rows until the last row has been processed. In other embodiments, a portion of the corresponding row on the back surface can be heated. For example, half of the corresponding row is heated followed by the other half. Other configurations of synchronized backside and frontside processing may also be useful.

By selectively heating the back surface of the wafer corresponding to the front surface of the wafer being processed, post-LSA budget variation within the wafer is reduced. This, in turn, reduces the dopant deactivation differences across the wafer. As a result, more uniform performance across the wafer is achieved.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of semiconductor fabrication which reduces large variations of resistance across a semiconductor wafer comprising:
    providing the semiconductor wafer having first and second opposing surfaces, the first surface is segmented into a plurality of first zones and the second surface is segmented into a plurality of second zones, wherein the first zones on the first surface have at least substantially corresponding second zones on the second surface;
    processing the first zones on the first surface in a first ordered sequence to activate dopants in the semiconductor wafer; and processing the corresponding second zones on the second surface in a second ordered sequence, wherein processing the first and corresponding second zones in the first and second ordered sequences simultaneously and synchronously reduces the problem of large variations of resistance across the semiconductor wafer.

2. The method of claim 1 wherein processing the first zones on the first surface comprises scanning the first surface with an excitation system, wherein scanning processes a row of zones.

3. The method of claim 2 wherein the excitation system comprises a laser excitation source.

4. The method of claim 2 wherein the excitation system comprises a laser excitation source and an optical system for focusing an excitation image from the excitation source onto the first surface of the semiconductor wafer.

5. The method of claim 4 wherein the excitation system is translated to process the zones on the first surface.

6. The method of claim 1 wherein processing the zones on the first surface comprises repeatedly scanning the first surface with an excitation system to repeatedly process rows of zones, in the first ordered sequence, until all zones are processed.

7. The method of claim 6 wherein the excitation system comprises a laser excitation source.

8. The method of claim 6 wherein the excitation system comprises a laser excitation source and an optical system for focusing an excitation image from the excitation source onto the first surface of the semiconductor wafer.

9. The method of claim 8 wherein the excitation system is translated to process the zones on the first surface.

10. The method of claim 1 wherein processing the zones on the first and second surfaces comprises heating the zones on the first and second surfaces.

11. The method of claim 1 wherein the first zones on the first surface is processed by a first heating source and the corresponding second zones on the second surface is processed by a second heating source, and wherein the first and second heating sources are different types of heating sources.

12. The method of claim 1 wherein the first zones of the first surface is processed in the first ordered sequence in a first direction and the corresponding second zones of the second surface is processed in the second ordered sequence in the same first direction.

13. The method of claim 12 wherein the first direction is parallel to the first surface of the semiconductor wafer.

14. The method of claim 1 wherein processing the corresponding second zones on the second surface comprises heating the second surface with a second surface heating source.

15. The method of claim 14 wherein the second surface heating source comprises a lamp array.

16. A method of fabricating a semiconductor device comprising:

providing a semiconductor wafer having first and second opposing surfaces, the first surface is segmented into a plurality of first zones and the second surface is segmented into a plurality of second zones, wherein the first zones on the first surface have at least substantially corresponding second zones on the second surface;

processing the first zones on the first surface in a first ordered sequence to activate dopants in the semiconductor wafer; and processing the corresponding second zones on the second surface in a second ordered sequence, wherein processing the first and corresponding second zones in the first and second ordered sequences reduce the problem of large variations of resistance across the semiconductor wafer.

17. The method of claim 16 wherein the first zones of the first surface is processed in the first ordered sequence in a first direction which is parallel to the first surface and the corresponding second zones of the second surface is processed in the second ordered sequence in the same first direction.

18. The method of claim 16 wherein processing the zones on the first surface comprises scanning the first surface of the article with an excitation system, wherein scanning processes a row of zones.

19. The method of claim 18 wherein the excitation system comprises a laser excitation source.

20. The method of claim 16 wherein:

the first zones on the first surface is processed by a first heating source and the corresponding second zones on the second surface is processed by a second heating source, and wherein the first and second heating sources are different types of heating sources.

21. A method of semiconductor fabrication comprising:

providing a semiconductor wafer having first and second opposing surfaces, the first surface is segmented into a plurality of first zones and the second surface is segmented into a plurality of second zones, wherein the first zones on the first surface have at least substantially corresponding second zones on the second surface;

processing the first zones on the first surface in a first ordered sequence in a first direction to activate dopants in the semiconductor wafer;

processing the corresponding second zones on the second surface in a second ordered sequence in the same first direction, wherein processing the first and corresponding second zones in the first and second ordered sequences simultaneously reduce the problem of large variations of resistance across the semiconductor wafer.

22. The method of claim 21 wherein the first zones on the first surface is processed by a first heating source and the corresponding second zones on the second surface is processed by a second heating source, and wherein the first and second heating sources are different types of heating sources.

23. The method of claim 21 wherein the first direction is parallel to the first surface of the semiconductor wafer.

\* \* \* \* \*